(12) United States Patent
Birner et al.

(10) Patent No.: US 7,084,043 B2
(45) Date of Patent: Aug. 1, 2006

(54) METHOD FOR FORMING AN SOI SUBSTRATE, VERTICAL TRANSISTOR AND MEMORY CELL WITH VERTICAL TRANSISTOR

(75) Inventors: Albert Birner, Dresden (DE); Steffen Breuer, Heiddorf (DE); Matthias Goldbach, Dresden (DE); Joern Luetzen, Dresden (DE); Dirk Schumann, Schoenfliess (DE)

(73) Assignee: Infineon Technologies AG, Munich (DE)

( * ) Notice: Subject to any disclaimer, the term of this patent is extended or adjusted under 35 U.S.C. 154(b) by 314 days.

(21) Appl. No.: 10/792,691

(22) Filed: Mar. 5, 2004

(65) Prior Publication Data

US 2004/0197965 A1   Oct. 7, 2004

Related U.S. Application Data

(63) Continuation of application No. PCT/DE02/03023, filed on Aug. 19, 2002.

(30) Foreign Application Priority Data

Sep. 7, 2001   (DE) ................... 10143936

(51) Int. Cl.
*H01L 21/76*   (2006.01)
*H01L 21/31*   (2006.01)

(52) U.S. Cl. .................. 438/408; 438/429; 438/770
(58) Field of Classification Search ................ 438/408, 438/411, 413, 429, 770
See application file for complete search history.

(56) References Cited

U.S. PATENT DOCUMENTS 4,914,628 A   4/1990   Nishimura 5,177,576 A   1/1993   Kimura et al.
5,256,588 A   10/1993   Witek et al.
5,365,097 A   11/1994   Kenney (Continued)

FOREIGN PATENT DOCUMENTS

EP   0501119 A2   9/1992

(Continued)

OTHER PUBLICATIONS

V. Lehmann et al., "On the Morphology and the Electrochemical Formation Mechanism of Mesoporous Silicon". Materials Science and Engineering B69 70, 2000, pp. 11-22, Elsevier Science S.A., Munich, Germany.

*Primary Examiner*—Michael Lebentritt
*Assistant Examiner*—Ron Pompey
(74) *Attorney, Agent, or Firm*—Edell, Shapiro & Finnan, LLC

(57) ABSTRACT

A method for producing a silicon-on-insulator layer structure on a silicon surface with any desired geometry can locally produce the silicon-on-insulator structure. The method includes formation of mesopores in the silicon surface region, oxidation of the mesopore surface to form silicon oxide and rib regions from silicon in single-crystal form; and execution of a selective epitaxy process that that silicon grows on the uncovered rib regions, selectively with respect to the silicon oxide regions. Rib regions remain in place between adjacent mesopores, this step being ended as soon as a predetermined minimum silicon wall thickness of the rib regions is reached, the uncovering of the rib regions, which are arranged at the end remote from the semiconductor substrate between adjacent mesopores. The method can be used to fabricate a vertical transistor and a memory cell having a select transistor of this type.

8 Claims, 13 Drawing Sheets

U.S. PATENT DOCUMENTS

| | | |
|---|---|---|
| 5,641,694 A | 6/1997 | Kenney |
| 6,127,246 A * | 10/2000 | Fukuda ..................... 438/478 |
| 6,262,448 B1 | 7/2001 | Enders et al. |
| 6,559,069 B1 * | 5/2003 | Goldbach et al. ........... 438/770 |
| 6,949,444 B1 * | 9/2005 | Torres et al. ............... 438/405 |
| 2003/0201479 A1 | 10/2003 | Birner et al. |

FOREIGN PATENT DOCUMENTS

| | | |
|---|---|---|
| EP | 0996145 A2 | 4/2000 |
| EP | 1009024 A1 | 6/2000 |
| WO | WO 99/25026 A1 | 5/1999 |
| WO | WO 02/073663 A1 | 9/2002 |
| WO | WO 03/0101826 A3 | 2/2003 |

* cited by examiner

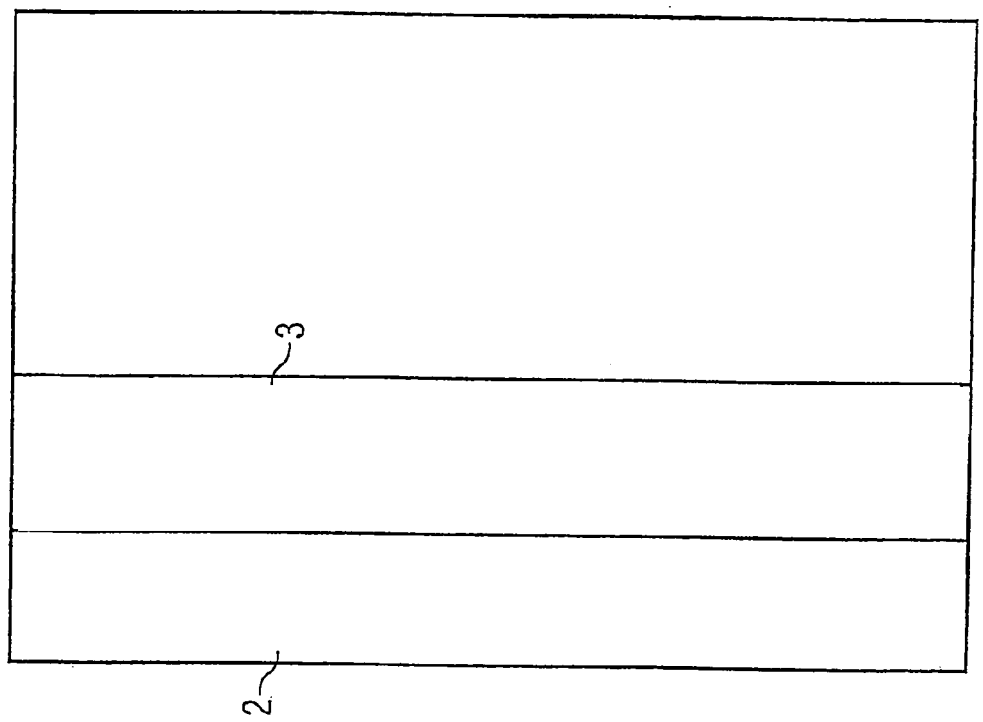
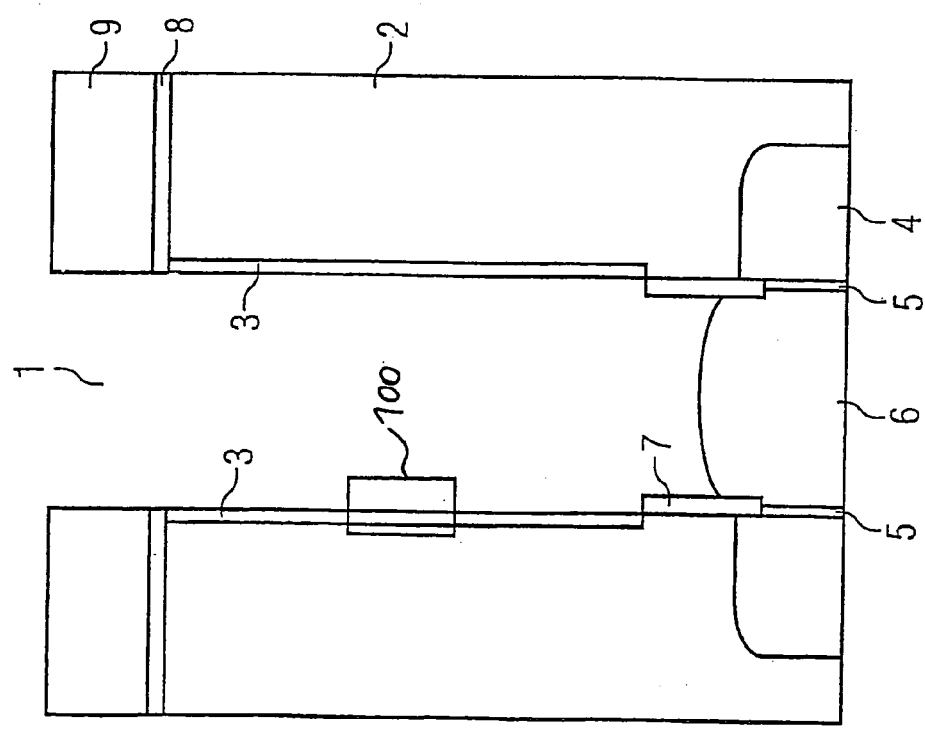

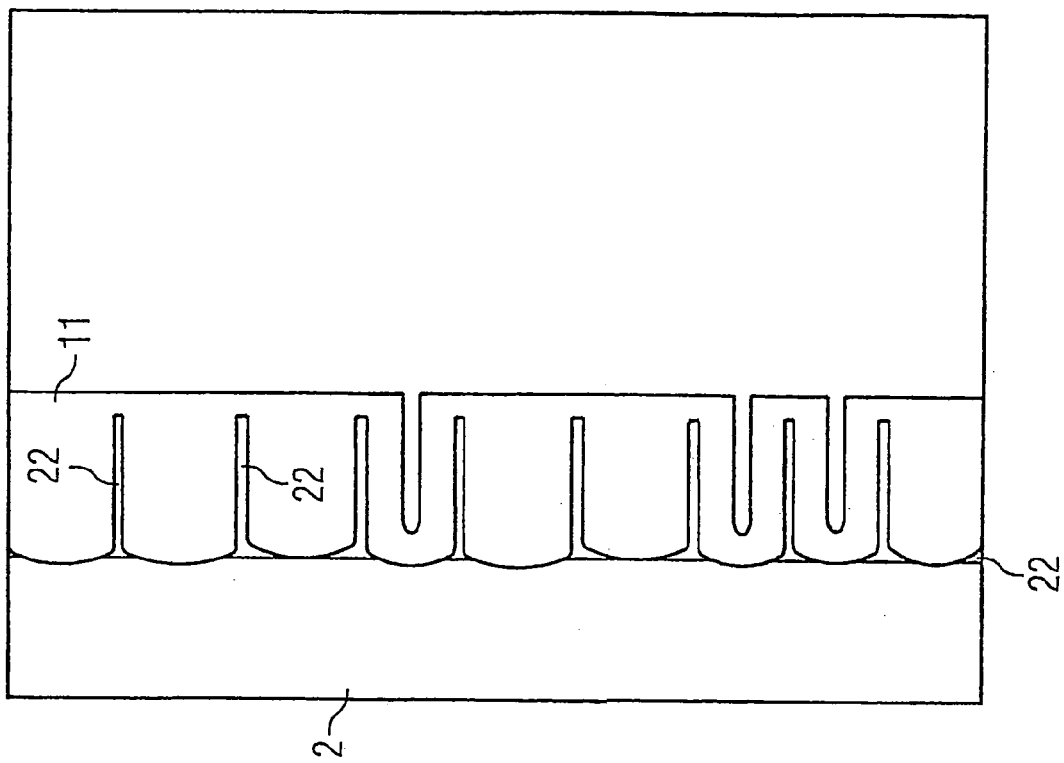
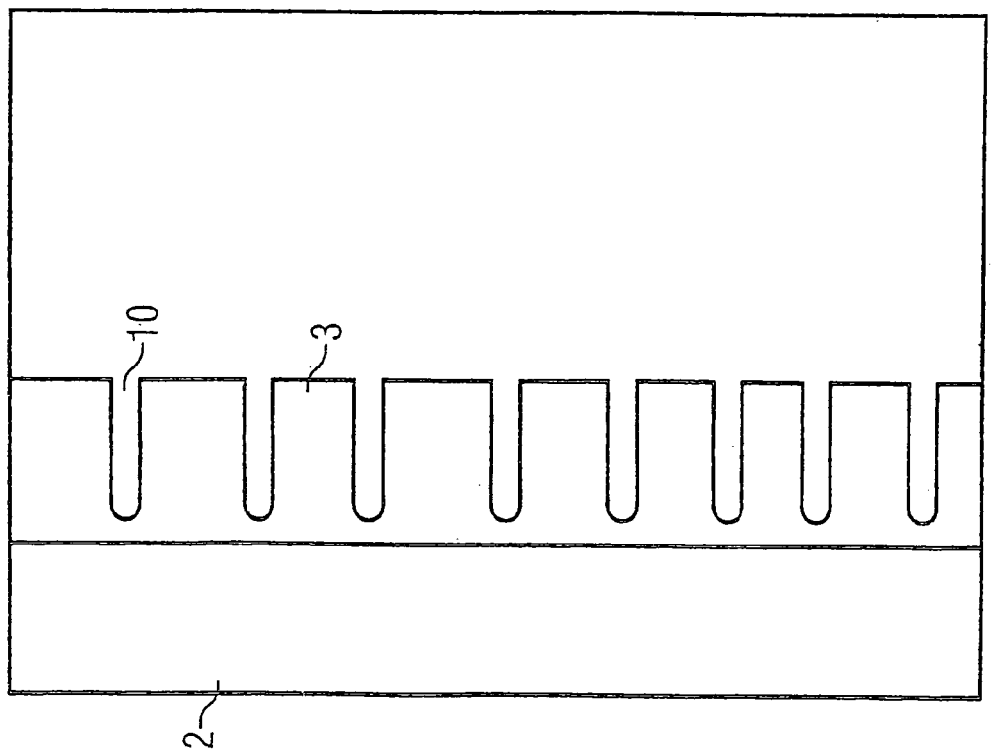

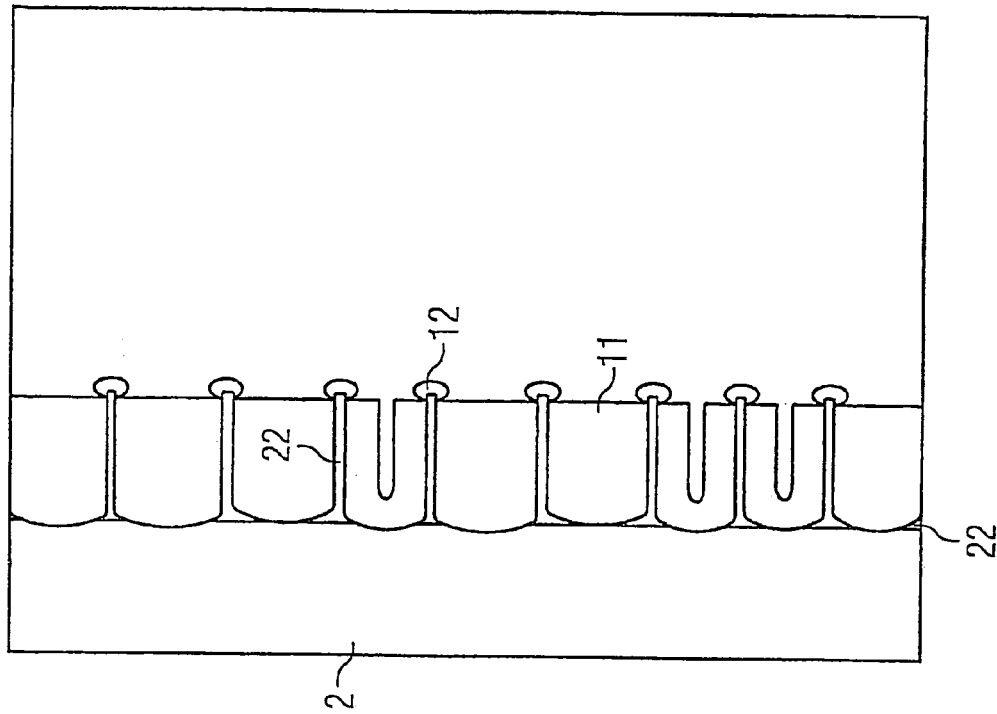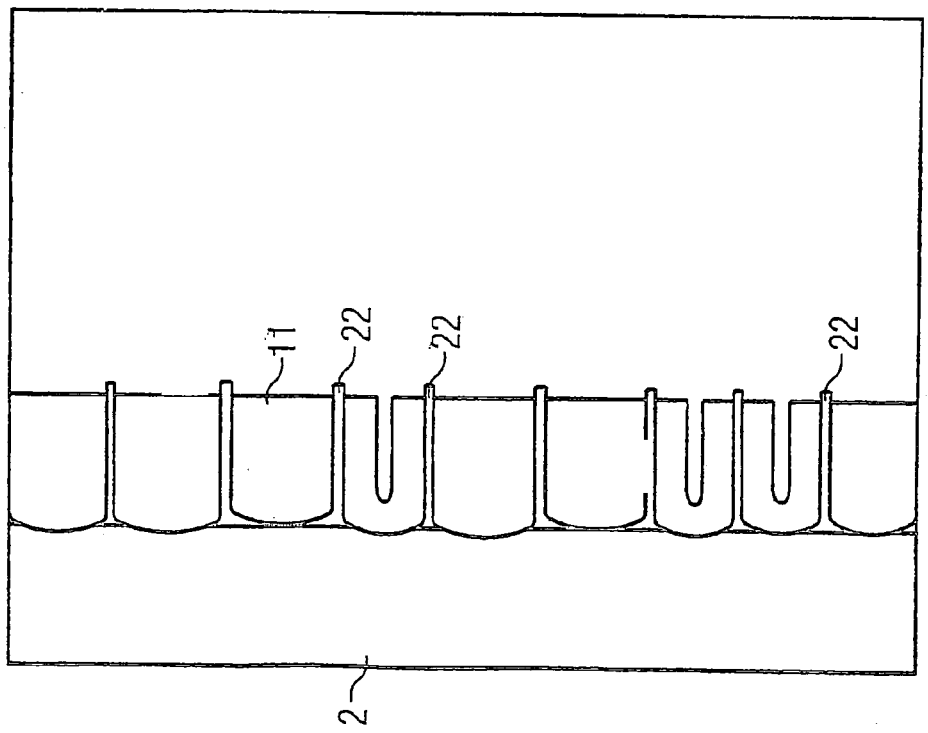

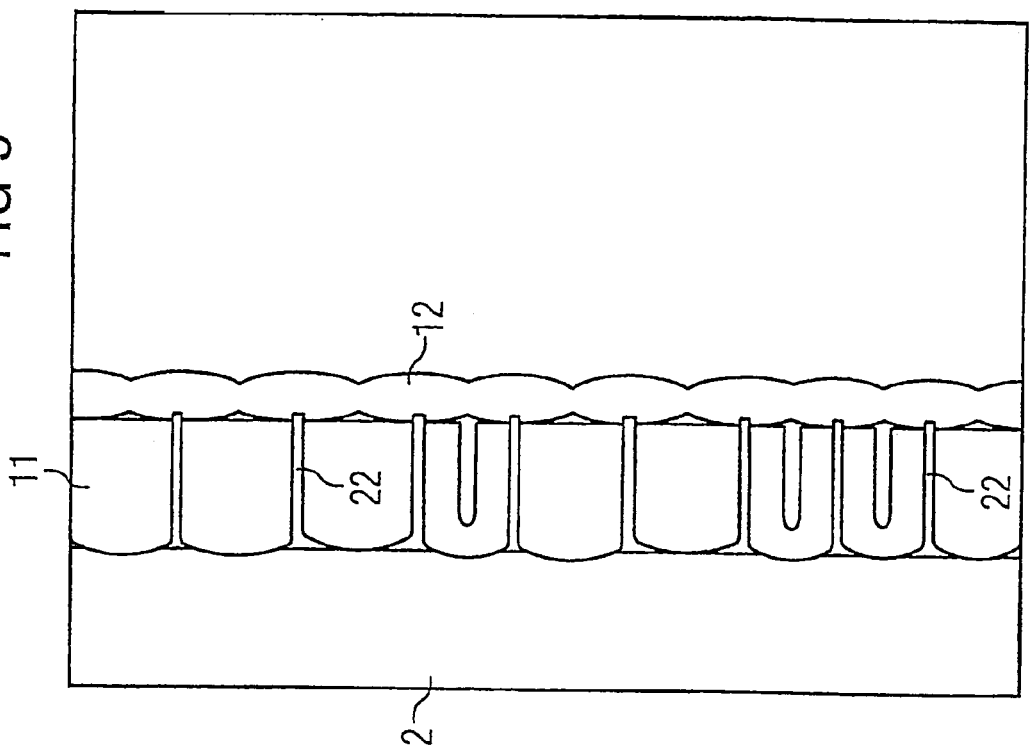
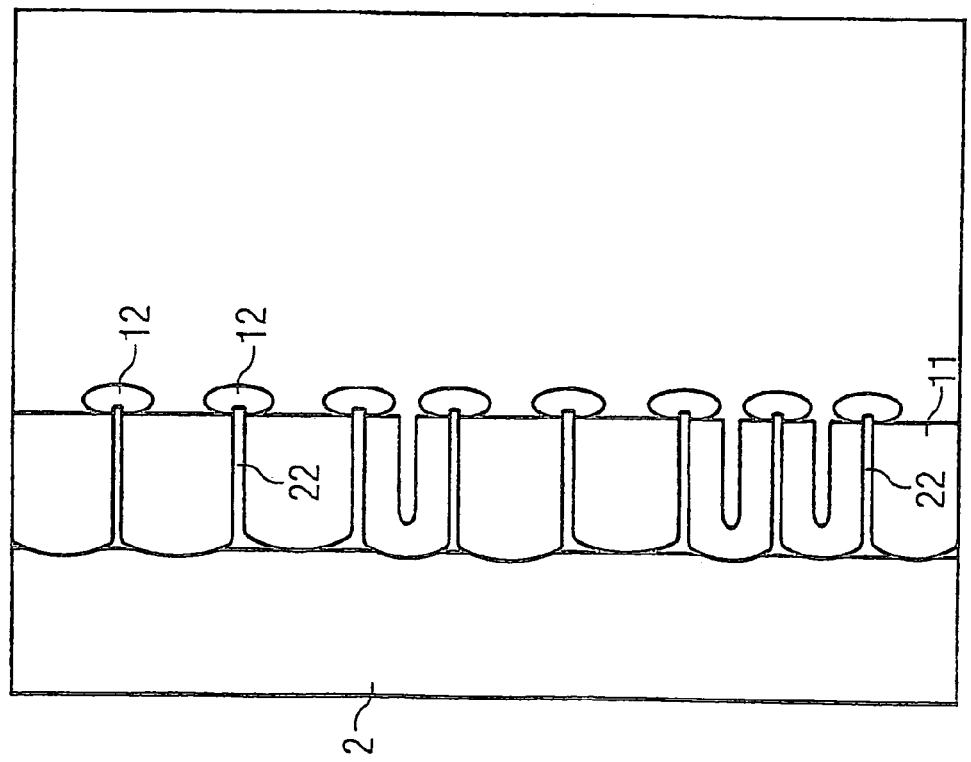

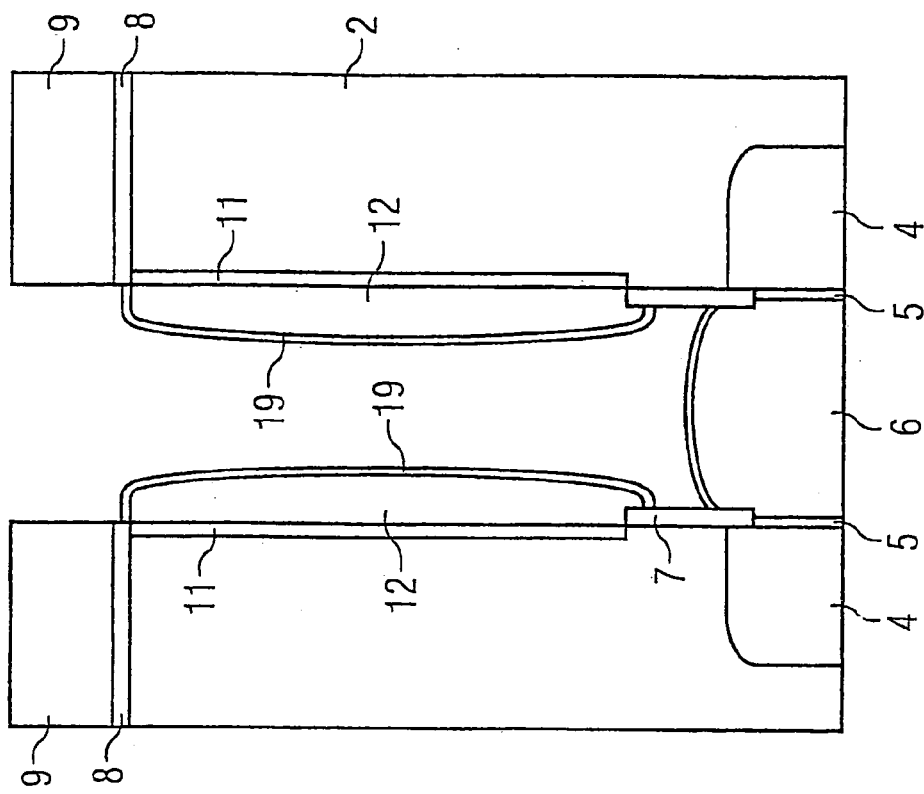
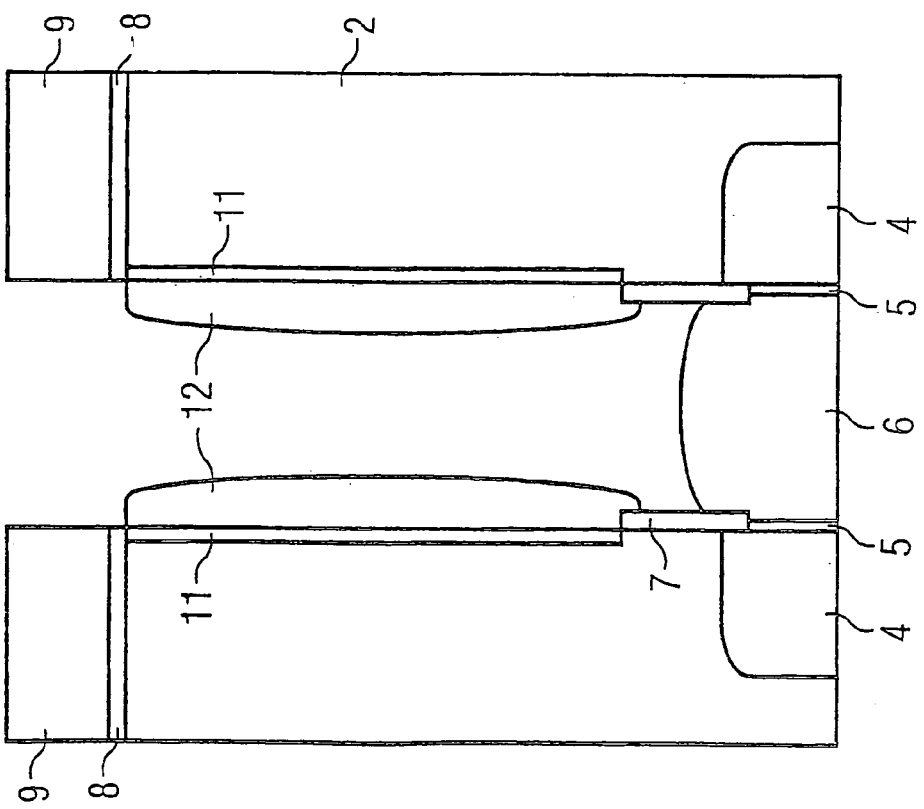

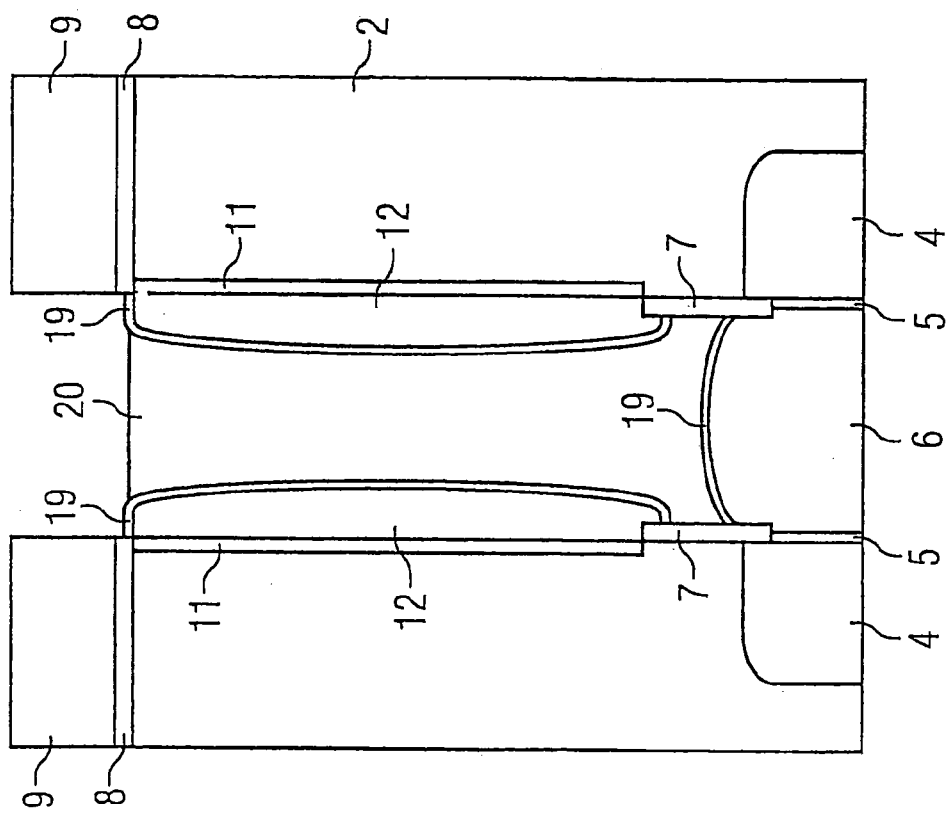
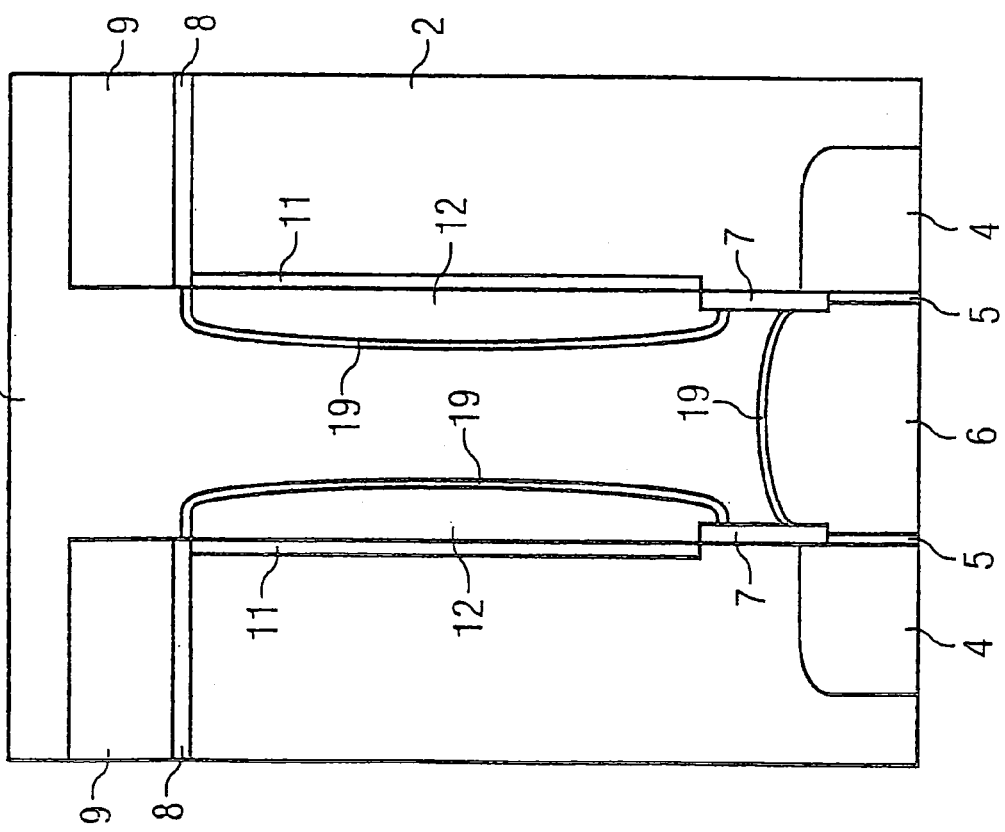

METHOD FOR FORMING AN SOI SUBSTRATE, VERTICAL TRANSISTOR AND MEMORY CELL WITH VERTICAL TRANSISTOR

CROSS REFERENCE TO RELATED APPLICATIONS

This application is a continuation of PCT Application No. PCT/DE02/03023, filed on Aug. 19, 2002, and titled "Method for Forming an SOI Substrate, Vertical Transistor and Memory Cell with Vertical Transistor," which claims priority from German Patent Application No. DE 10143936.9, filed on Sep. 7, 2001, and titled "Method for Forming an SOI Substrate, Vertical Transistor and Memory Cell with Vertical Transistor," the entire contents of which are hereby incorporated by reference.

FIELD OF THE INVENTION

The invention relates to a method for producing a silicon-on-insulator layer structure, a vertical transistor, and a memory cell with a vertical transistor.

BACKGROUND

Silicon-on-Insulator (SOI) structures are playing an increasingly important role in MOSFET technology, in particular, on account of their high working frequencies, low power losses, and low working voltages. Hitherto, the starting point has primarily been planar base substrates with an electrically insulating oxide layer and a thin active film. For recent component developments, it would be extremely advantageous if monocrystalline silicon regions which have an insulating layer, such as, for example, silicon oxide, around, or beneath them could be produced locally.

SUMMARY

The method of the present invention can allow silicon regions of this type to be produced and patterned as desired.

The present invention can be used for the fabrication of DRAM memory cells, i.e., dynamic random access memories. Memory cells of this type, which are produced almost exclusively as single-transistor memory cells, generally comprise a read transistor and a storage capacitor. The information is stored in the storage capacitor in the form of an electric charge, which represents a logic "0" or a logic "1". This information can be read out via a bit line as a result of the read transistor being driven via a wordline. The storage capacitor must have a minimum capacitance for reliable storage of the charge and, at the same time, to make it possible to differentiate the information item which has been read. The lower limit for the capacitance for the storage capacitor is currently considered to be 25 fF (femto-Farad).

Since the storage density increases from memory generation to memory generation, the surface area required by the single-transistor memory cell must be reduced from generation to generation. At the same time, the minimum capacitance of the storage capacitor has to be retained.

Up to the 1 Mbit generation, both the read transistor and the storage capacitor have been produced as planar components. Beyond the four Mbit memory generation, the area taken up by the memory cell was reduced further by using a three-dimensional arrangement of read transistor and storage capacitor. One possibility is for the storage capacitor to be produced in a trench. In this case, a diffusion region, which adjoins the wall of the trench, and a doped polysilicon filling arranged in the trench act as electrodes for the storage capacitor. Therefore, the electrodes of the storage capacitor are arranged along the surface of the trench. In this way, the effective surface area of the storage capacitor, on which the capacitance is dependent, is increased with respect to the space taken up by the storage capacitor on the surface of the substrate, which corresponds to the cross section of the trench. Reducing the cross section of the trench enables the packing density to be increased further. However, limits are imposed on the extent to which the depth of the trench can be increased, for technological reasons.

In DRAM memory cells of the future generation, with feature sizes of less than 100 nm, furthermore, a change from the planar select transistor which is currently used to a vertical transistor is foreseeable. As will be described below, the method according to the invention can be used to fabricate a vertical transistor of this type with an active area in single-crystal form on an oxide barrier, which are both arranged concentrically and are formed in the form of thick cylinder casings.

Hitherto, thin SOI films have been formed, in particular, by bonding two oxidized silicon wafers, by the SIMOX process or by local overgrowth of oxide islands on a silicon substrate.

In the SIMOX (Separation by Implantation of Oxygen) process, by way of example, a high oxygen doping (approximately $10^{18}$ cm$^{-2}$) is implanted in a mono-crystalline silicon substrate at a depth of 0.1 to 1 μm, resulting in the formation of a buried SiO$_2$ layer with a monocrystalline SOI layer with a thickness of 0.1 to 1 μm above it. The crystal damage in the silicon lattice formed as a result of the deceleration of the oxygen ions is annealed out again immediately after it has been formed by a high-temperature treatment during the implantation. If the SIMOX method is integrated in the method for fabricating DRAM memory cells, therefore, this results in the drawback that a high-temperature step is carried out, as a result of which structures which have been produced hitherto are impaired. A further drawback is the crystal damage caused by the ion implantation.

Furthermore, consideration is given to producing the active areas of vertical select transistors on an insulating oxide layer by lateral, selective epitaxial overgrowth. In this case, a relatively large oxide cylinder which is embedded in a capacitor trench has to be overgrown epitaxially from above. Since, in the process, relative large oxide surfaces have to be overgrown without any dislocations, the practical feasibility of concepts of this type appears highly critical.

A vertical select transistor for use in a DRAM memory cell with a trench capacitor is described in the art, for example, in U.S. Pat. No. 5,365,097.

An improved method for forming a layer stack including silicon oxide and a monocrystalline silicon layer on a silicon surface region of a semiconductor substrate is provided.

According to the present invention, a method for forming a layer stack comprising silicon oxide and a monocrystalline silicon layer on a silicon surface region of a semiconductor substrate, can include forming mesopores in the silicon surface region; oxidizing the mesopore surface to form silicon oxide and rib regions from silicon in single-crystal form, which rib regions remain in place between adjacent mesopores, until a predetermined minimum silicon wall thickness of the rib regions is reached; uncovering the rib regions, which are arranged at the end which is remote from the semiconductor substrate, between adjacent mesopores; and carrying out a selective epitaxy process, as a result of which silicon grows on the uncovered rib regions, selectively with respect to the silicon oxide regions.

Furthermore, the present invention can provide a vertical transistor which is formed in a trench formed in a semiconductor substrate and comprises a source electrode, a drain electrode and an electrically conductive channel, which connects the source and drain electrodes to one another, the source electrode, the drain electrode and the channel being formed from silicon in single-crystal form, and comprises a gate electrode, which is electrically separated from the channel by a gate insulation layer, one of the source and drain electrodes being arranged in a lower trench region and the other of the source and drain electrodes being arranged in an upper trench region, with the channel arranged between them, in which transistor the trench region in which the lower source or drain electrode and the channel region are arranged is completely separated from the semiconductor substrate by a silicon oxide layer.

Furthermore, the invention can provide a memory cell which includes a vertical transistor as described above, a storage capacitor, a trench which is formed in a semiconductor substrate and in which select transistor and storage capacitor are arranged together, and an electrically conductive connecting material, the storage capacitor comprising a lower capacitor electrode, which adjoins a wall of the trench, a storage dielectric and an upper capacitor electrode, which are each arranged in a lower section of the trench, the select transistor being arranged in an upper section of the trench, and the electrically conductive connecting material being arranged in the trench between lower and upper sections in order to provide a connection between upper capacitor electrode and source or drain electrodes of the select transistor.

The method according to the invention is therefore essentially based on an oxide layer with single-crystal seeds at its surface being produced on a silicon surface region of any desired geometry, on which mesopores can be formed. The oxide layer is preferably formed by self-limited electrochemical oxidation of the mesopore surface, this step being ended as soon as the wall thickness of the ribs between adjacent mesopores falls below a predetermined minimum silicon wall thickness, since then the space charge regions of adjacent mesopores adjoin one another and an ionic current which would effect oxidation is no longer flowing.

In this way, an $SiO_x$ layer which has thin seeds in the style of small rods passing through it is produced.

Then, the rib regions, which are arranged at the end remote from the semiconductor substrate, between adjacent mesopores which are covered by the silicon oxide layer, are uncovered, for example by etching with hydrofluoric acid. As a result the single-crystal seeds are uncovered and serve as crystallization seeds for the subsequent selective epitaxy, as a result of which the oxide layer is overgrown with a monocrystalline layer. During this selective epitaxy process, the silicon grows selectively on the uncovered rib regions with respect to the silicon oxide regions Since the single-crystal seeds each have the same orientation as the substrate, the layer produced is in single-crystal form, having the crystal orientation of the substrate.

Then, according to a preferred embodiment of the present invention, the rib regions between adjacent mesopores are oxidized by means of a heat treatment. The excess of oxygen in the silicon oxide layer formed which, when the oxide formation has taken place electrochemically, results from the incorporated OH groups, leads to partial oxidation of the rib regions. As a result, the epitaxially grown silicon layer is electrically insulated from the substrate Alternatively, it is possible to initiate partial oxidation after the epitaxy commenced but before the epitaxial layer is completely continuous. After a subsequent cleaning step using HF in order to eliminate surface oxides, the selective epitaxy process is continued until a continuous epitaxial layer is present.

However, this step may also be omitted if the complete electrical insulation does not impair the performance of the device produced, for example if there are only a few needles at a relatively great distance from one another or if no additional leakage currents are expected, since the oxide layer is relatively thick compared to the vertical extent of the transistor. It may be advantageous to omit this step if complete electrical insulation of the epitaxially grown silicon layer from the silicon substrate is not desired, for example in order to avoid what are known as floating body effects, which have an adverse effect on the properties of the component.

A buried oxide layer can be produced on silicon regions with any desired surface. Accordingly, it is possible to produce an SOI structure with a geometry which can be selected as desired, with numerous possible applications. In particular, an SOI structure can be produced locally, since the regions on which no SOI structure is to be produced can be covered by a mask.

The buried oxide layer can be produced without an additional thermal budget, since the electrochemical oxidation of the mesopores takes place at room temperature This makes it easy to integrate the method in existing fabrication methods.

The buried oxide layer can be produced in the substrate, i.e., there is no additional layer applied. If an SOI structure is to be produced, for example, in a capacitor trench, there is no narrowing of the trench cross section by the oxide layer.

Since the mesopore growth takes place in a self-limiting fashion in adjacent capacitor trenches, mesopore growth does not cause an electrical bridge to form from one capacitor trench to an adjacent capacitor trench. Accordingly, by way of example, the entire surrounding capacitor trench side wall can be used for integration of a vertical select transistor.

The step of uncovering the rib regions, which are arranged at the end remote from the semiconductor substrate, between adjacent mesopores can be carried out as an over-etching step, so that the epitaxial silicon layer can be grown on more densely at the surface region. In particular, if the SOI layer is to be produced in a capacitor trench, the trench cross section can be widened, since the growth of the epitaxial silicon layer begins further toward the radially outer side in the capacitor trench than the original trench inner surface lay.

If the SOI structure is produced locally, for example, as a result of the oxide layer being only partially buried, the epitaxially grown silicon layer can also be grown on epitaxially to the substrate below.

The use of local epitaxy means that it is possible to grow on relatively small layer thicknesses, which may be as little as the mean spacing between the silicon needles (a few tens of nm).

Since the buried oxide layer, unlike with the SIMOX process, is not produced by implantation, the crystal lattice is not damaged.

The method according to the invention can be carried out simply and at low cost. Therefore, it is more economical than the conventional methods.

Mesopores are electrochemically etched and then oxidized, and therefore, electrical contact with the region in which the mesopores are to be etched is necessary.

Since the method according to the invention can be used to produce an SOI structure on any desired silicon surface, there are numerous conceivable advantageous applications. For example, the method can be used to fabricate a vertical field-effect transistor in a trench formed in a semiconductor substrate. The vertical field-effect transistor comprises source and drain electrodes and an electrically conductive channel region which connects source and drain electrodes to one another, the source electrode, drain electrode and channel region being formed from silicon in single-crystal form, and a gate electrode, which is electrically separated from the channel region by a gate insulation layer, source or drain electrode being arranged in a lower trench region and the other electrode in each case being arranged in an upper trench region. According to the present invention, then, at least the trench region in which the lower source or drain electrode and the channel region are arranged is separate from the semiconductor substrate by a silicon oxide layer. Depending on the design of the transistor, the silicon oxide layer may also extend as far as the upper source or drain electrode. The region which includes the lower source or drain electrode and the channel region is to be separated from the substrate by the silicon oxide layer. The silicon oxide layer does not necessarily have to be completely electrically insulating, but rather it is also possible to dispense with the step of oxidation of the silicon rib regions in single-crystal form.

The vertical transistor according to the invention and the memory cell having a transistor of this type provide the following advantages:

The fact that the trench region, in which the lower source or drain electrode and the channel region are arranged, is separate from the semiconductor substrate by an $SiO_2$ layer such that there is no diffusion of the dopants out of the electrically conductive connecting material between upper capacitor electrode and lower source or drain electrode into the semiconductor substrate. This diffusion out of the buried strap region in the semiconductor substrate causes problems in conventional vertical transistors in that a depletion zone can be formed in the semiconductor substrate. If these depletion zones of adjacent transistors come into contact with one another, i.e., a floating body, which has a highly adverse effect on the transistor properties, can be formed in the upper substrate region.

In particular, in this case, control effects of the memory cell occur through the substrate. If a wordline is driven, there is also a risk of the adjacent wordlines being influenced. For this reason, outdiffusion of dopants into the semiconductor substrate is avoided. Concepts according to which this is attempted by using an $SiO_2$ layer which only covers the lower half of the trench, so that epitaxial growth is possible in the upper half of the trench, as described, for example, in U.S. Pat. No. 5,365,097, are disadvantageous, since half-height oxide layers are difficult to manage. Problems occur as a result of the reduction of the size of the trench cross section in the lower trench region. Furthermore, there are large interfaces between polysilicon and epitaxially grown silicon, with the result that grain boundaries butt against one another, dislocations are produced and further drawbacks are caused.

By the method according to the invention for forming a layer stack comprising silicon oxide and a monocrystalline silicon layer on a silicon surface region of a semiconductor substrate, a vertical transistor in which the trench region comprising silicon in single-crystal form, in which the lower source or drain electrode and the channel region are arranged, is separate from the semiconductor substrate by an $SiO_2$ layer can be provided. The $SiO_2$ layer may be studded with individual silicon single-crystal ribs if, as described above, the step of oxidizing the rib regions has not been carried out. Also, the outdiffusion of dopants can be prevented.

BRIEF DESCRIPTION OF THE FIGURES

The present invention is explained in more detail below with reference to the appended drawings, in which:

FIGS. 2 to 11 show the steps of the inventive method for forming an SOI substrate on the basis of an excerpt from FIG. 1;

FIGS. 12 to 22 show the steps of forming a vertical transistor in accordance with one embodiment of the present invention.

DETAILED DESCRIPTION

Figure 1:
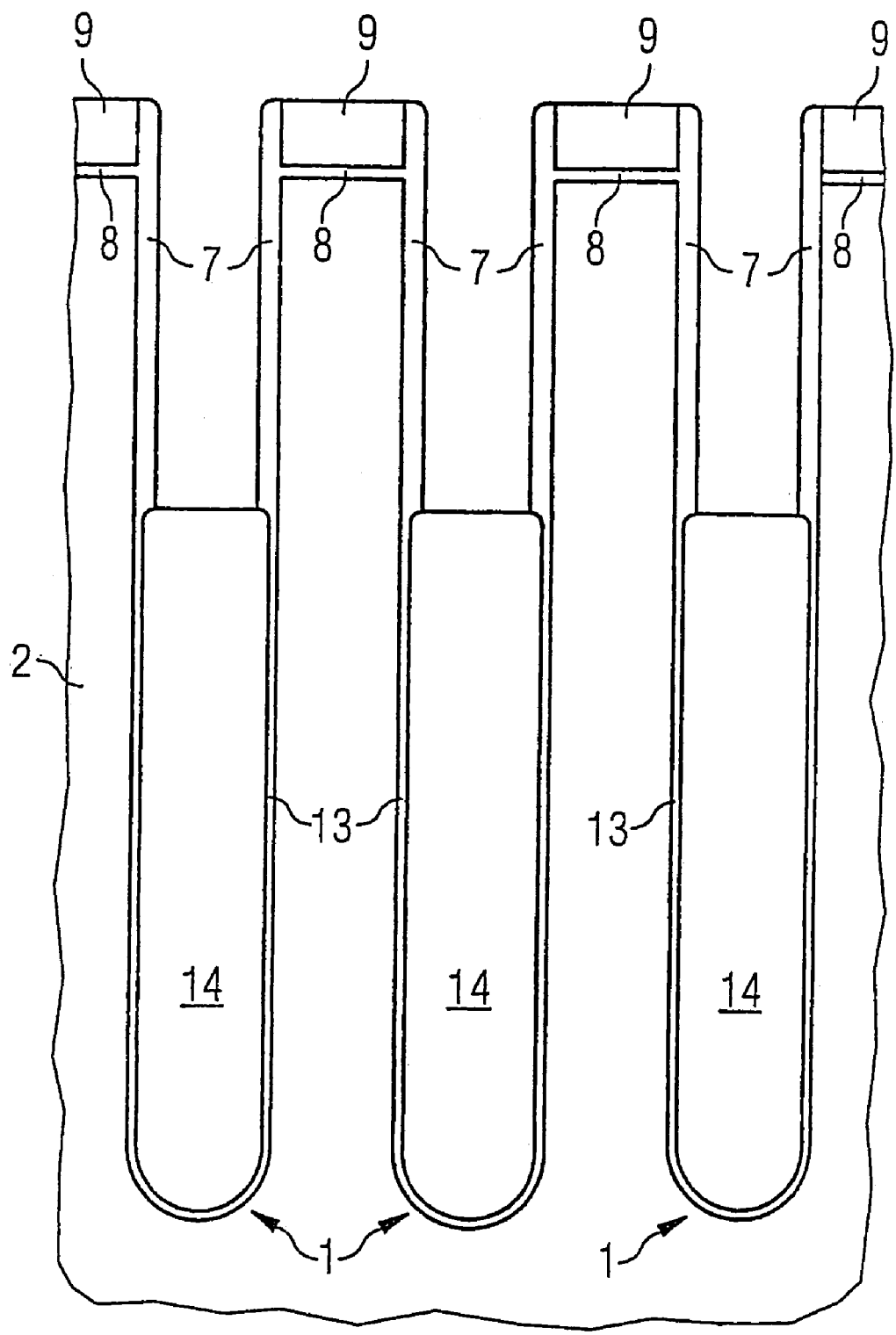
FIG. 1 shows a semiconductor substrate with etched trenches before the formation of a storage capacitor.
Figure 11:
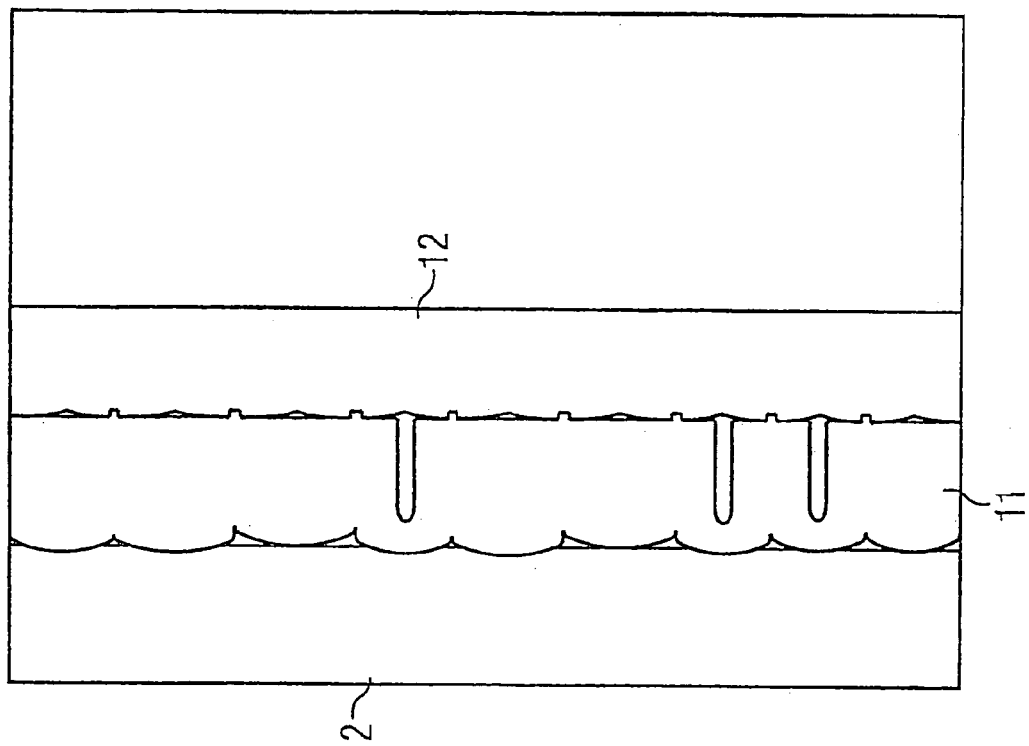

FIG. 2 shows a capacitor trench 1, which is formed in a p-doped silicon substrate 2. The storage capacitor can be formed in the lower part of the capacitor trench 1 from a lower capacitor electrode 4 including n-doped silicon, a capacitor dielectric 5, for example, including a silicon dioxide/silicon nitride layer stack, and an upper capacitor electrode 6 including n-doped polysilicon. A silicon dioxide region as insulation collar 7 can be arranged above the capacitor dielectric On the substrate surface, there can be a thin silicon dioxide layer 8 and a thicker silicon nitride layer 9 as hard-mask material.

To form the capacitor trench with storage capacitor shown in FIG. 2, as well as the insulation collar, as can be seen from FIG. 1, a 5 nm thick $SiO_2$ layer 8 and a 200 nm thick $Si_3N_4$ layer 9 can be applied to a p-doped silicon substrate 2. A 1000 nm thick borosilicate glass layer (not shown, referred to as "BSG layer" below) is then applied as hard-mask material.

The BSG layer, the $Si_3N_4$ layer 9 and the $SiO_2$ layer 8 can be patterned in a plasma etching process with $CF_4/CHF_3$ using a photolithographically produced mask ("Deep Trench Mask Open"), which mask is not illustrated, so that a hard mask can be formed. After the photolithographically produced mask has been removed, trenches 1 can be etched into the main surface of the silicon substrate 2 using the hard mask as etching mask in a further plasma etching process using $HBr/NF_3$. Then, the BSG layer can be removed by a wet etch using $H_2SO_4/HF$.

The trenches 1 have, for example, a depth of 5 μm and a width of 100×250 nm and are at a distance of 100 nm from one another.

Then, a 10 nm thick $SiO_2$ layer 13 can be produced, which may also be doped, for example, by in-situ doping, deposited or produced by thermal oxidation The $SiO_2$ layer 13, which has been deposited, can cover at least the walls of the trenches 1. A polysilicon filling 14, the surface of which is arranged 1000 nm below the main surface, can be produced in each of the trenches 1 by deposition of a 200 nm thick polysilicon layer, chemical mechanical polishing down to the surface of the $Si_3N_4$ layer 9 and etching back of the polysilicon layer using $SF_6$. If appropriate, the chemical mechanical polishing can be dispensed with. The polysilicon filling 14 can serve as a sacrificial layer for the subsequent $Si_3N_4$ spacer deposition Then, the $SiO_2$ layer 13 on the walls of the trenches 1 can be etched isotropically.

Then, a 20 nm thick spacer layer 7, for example, including silicon dioxide, can be deposited in a CVD process and can be etched in an anisotropic plasma etching process using $CHF_3$. In the finished memory cell, the spacer layer 7, which has just been deposited, can be used to disconnect a parasitic transistor which would otherwise form at this location, and can take over the role of the insulation collar (cf. FIG. 1).

Then, polysilicon can be etched selectively with respect to $Si_3N_4$ and $SiO_2$ using $SF_6$. In the process, the polysilicon filling 14, in each case, can be removed completely from the trench 1. The part of the $SiO_2$ layer 13, which is now uncovered, can be removed by an etch using $NH_4F/HF$.

Then, if this has not already been effected by the doped oxide, the silicon substrate can be doped. This can take place, for example, by deposition of an arsenic-doped silicate glass layer in a layer thickness of 50 nm and a TEOS-$SiO_2$ layer in a thickness of 20 nm, followed by a heat-treatment step at 1000° C., 120 seconds, with the result that an $n^+$-doped region 4 is formed by diffusion out of the arsenic-doped silicate glass layer into the silicon substrate 2. Alternatively, vapour-phase doping may also be carried out, for example, using the following parameters: 900° C., 399 Pa tributylarsine (TBA) [33 per cent], 12 min.

The $n^+$-doped region 4 can act as the lower capacitor electrode. The high doping can reduce the size of the depletion zone, with the result that the capacitance of the capacitor is increased further.

Then, a 5 nm thick dielectric layer 5, which contains $SiO_2$ and $Si_3N_4$, and also, if appropriate, siliconoxynitride, can be deposited as capacitor dielectric. This layer sequence may be produced by steps of nitride deposition and of thermal oxidation, in which defects in the layer below can be annealed. Alternatively, the dielectric layer 5 can contain $Al_2O_3$ (aluminium oxide), $TiO_2$ (titanium dioxide), $Ta_2O_5$ (tantalum oxide). Then, a 200 nm thick in-situ n-doped polysilicon layer 6 can be deposited. The polysilicon layer 6 can be removed down to the surface of the $Si_3N_4$ layer 9 by chemical mechanical polishing. Then, the polysilicon filling 15 can be etched down to approximately 500 nm below the main surface. This can be followed by etching of the capacitor dielectric in the upper trench region using known processes and an $SiO_2$ etch using $NH_4F/HF$ in order to remove the insulation collar 9 in the upper trench region.

Then, a further 1000 nm of polysilicon can be etched, resulting in the structure shown in FIG. 2.

Then, the method according to the invention for producing an SOI structure in the upper trench region can be carried out.

First of all, to produce mesopores, an ohmic contact can be produced over the entire back surface of the substrate. This may take place, for example, by high doping of the substrate back surface or by application of a metallic layer. High doping of the substrate back surface may be effected by implantation of a p-dopant, such as B, Al, In, Ga, Tl with subsequent activation, the implantation taking place directly at the surface, or, if an additional layer, such as, for example, a pad oxide or a pad nitride, has been applied to the back surface, may take place through this additional layer.

Alternatively, the back-surface doping may also take place by deposition of borosilicate glass followed by a heat-treatment step at a temperature, which is typically greater than 700° C., during which step the boron atoms pass over into the substrate.

If the ohmic back-surface contact is produced by application of a metallic layer, the metal/substrate junction can form an ohmic contact, since otherwise considerable potential fluctuations will again form at that location. In this case, the electrical connection to a voltage source, which can be produced, for example, by metallic contact peaks or by an electrolyte contact, can remain locally limited This means that the metallic contact peaks can be arranged at a very great distance from one another on the back surface, making electrical connection extremely simple, so that this solution is particularly advantageous.

Overall, a metal, such as tungsten silicide can be used for the formation of the metallic layer, since in this case diffusion of the metal atoms into the substrate regions in which the transistor is subsequently to be formed can be substantially avoided.

Then, a doped region 3, which is suitable for mesopore etching, can be produced in the trench wall above the insulation collar 7. For this purpose, n-doping with a suitable dopant concentration, by which the density of the mesopores formed can be determined, can be carried out. The regions in which the mesopores are to be etched may also be p-doped but mesopore etching in p-doped silicon is more difficult to control.

In the present case, an n-dopant concentration of approximately $1*10^{16}$ cm$^{-3}$ to approximately $1*10^{19}$ cm$^{-3}$ can be used.

For this purpose, an $SiO_2$, which has been provided with the corresponding dopant, may be deposited in the trench at the corresponding locations at which mesopores are to be formed. Then, a drive-in step can be carried out, which involves a heat treatment which causes the doping atoms to diffuse into the substrate. In this case, the regions which are not to be doped, i.e., in particular the collar region, can be covered by a suitable protective layer.

The trench region may also be doped by doping from the vapour phase. In this case, the region of the insulation collar has to be protected by a covering layer, in order to prevent the insulation collar from being doped. An excerpt 100 of the trench region in which mesopores are to be etched is shown in FIG. 3. FIGS. 3 to 11 relate to the further procedure in this excerpt 100.

Then, the mesopores 10 can be etched electrochemically, with the ohmic back-surface contact acting as anode.

For this purpose, the substrate back surface is connected in an electrically conductive manner to the positive output of a voltage source, while a cathode which is likewise connected to the voltage source can be placed in the electrolyte, which is in contact with the substrate surface. The counter electrode may be formed as a solid body, for example, a platinum electrode, in the liquid.

The electrolyte may, for example, be a 1% strength to 6% strength aqueous hydrofluoric acid or a mixture which contains tetramethylammonium hydroxide and hydrofluoric acid.

The substrate surface can be covered by the silicon dioxide layer 8 and the silicon nitride layer 9 to prevent the etching current from flowing out via the substrate surface. Accordingly, mesopores can be formed in the n-doped silicon.

The formation of mesopores in n-doped silicon in principle can use very similar parameters to those used for forming mesopores in p-doped silicon. When using a substrate with bulk p-doping and additional p-doped and n-doped regions, and when it is intended to produce the mesopores in the n-doped regions, the p-doped regions can be electrically insulated from the electrolyte or the back-surface contact either by the application of a covering material or by other suitable measures, since otherwise the current would flow entirely via the p-regions and there would be no formation of mesopores in the n-doped regions.

The process for the electrochemical etching of mesopores in n-doped silicon is described in V. Lehmann et al., Materials Science and Engineering B69–70 (2000) pp. 11 to 22.

Switching on the voltage source can effect a voltage between substrate front surface and substrate back surface, causing an etching current. The electrons can be drawn to the substrate back surface. On account of the simultaneous presence of the electrolyte, electrons from the electrolyte can be injected into the semiconductor at the substrate front surface, which has a depletion of electronic holes, so that in an anodic reaction silicon atoms are individually detached, with the result that mesopores can be etched.

This mesopore etching proceeds in a self-limited fashion in adjacent capacitor trenches, i.e., it stops as soon as the silicon layer thickness between the mesopores of adjacent capacitor trenches falls below a predetermined minimum silicon layer thickness. As soon as the space charge regions of the mesopores of adjacent capacitor trenches come into contact with one another, in these regions, there is a very high resistance with respect to the substrate bulk below and the etching current is stopped so that the etching process ceases.

This self-limiting effect prevents electrical short circuits from being formed by the mesopores of adjacent capacitor trenches.

The trench region after mesopore etching is shown in FIG. 4.

After the mesopore etching, a partial electrochemical oxidation process can be carried out, by which the mesopore walls can be covered with a silicon oxide layer 11. For this purpose, the surface of the mesopores can contact with a suitable electrolyte, and a voltage can be applied via the back-surface contact, produced for the mesopore etching between the silicon substrate and the electrolyte via a platinum grid electrode as cathode. Suitable electrolytes can include, in particular, aqueous dilute acids, such as, for example, a 0.01 mol sulphuric or hydrochloric acid.

The partial electrochemical oxidation of the mesopores can be carried out using the self-limiting effect. The voltage is set such that the silicon layer is not completely consumed between adjacent mesopores, and a minimum silicon layer thickness can remain in place between adjacent mesopores. This utilizes the effect according to which the oxide growth ceases as soon as the space charge regions of adjacent mesopores formed at the mesopore-electrolyte interface come into contact with one another. This is because in this case at the surface of the mesopores there is no longer an active field which could cause oxygen ions and $OH^-$ groups to diffuse out of the electrolyte into the silicon surface region, where they could convert the silicon into $SiO_x$.

After this process step, regions in needle form will still be present in the oxide region, as shown in FIG. 5, and these regions can be connected to the p-doped silicon region and can be surrounded by oxide. The diameter of the regions in needle form can be approximately 10 nm, depending on the doping of the n-doped silicon region.

In a subsequent wet-etching step in a solution which contains hydrofluoric acid, the surface regions of these areas in needle form can be uncovered again, as shown in FIG. 6. The points which are now uncovered can serve as seeds for the silicon growth in single-crystal form during the subsequent selective epitaxy process, as indicated in FIG. 7. The selective epitaxy is carried out, for example, using silane or dichlorosilane and an etching gas, such as, for example, HCl. This makes use of the effect whereby the etching gas etches away the epitaxially grown silicon at different rates depending on the material below it. The process parameters of the epitaxy process can be set such that the silicon material, which has been grown on silicon can be etched away more slowly than the silicon growth rate, so that overall the silicon layer thickness can increase on the silicon regions which have already been formed. On the other hand, the silicon material, which has been grown on silicon oxide, can be etched away more quickly than the silicon growth rate, so that overall no silicon grows on the silicon oxide regions. For example, the selective epitaxy process may be carried out at a temperature of approximately 900° C. and with a higher flow rate of dichlorosilane than of HCl. In particular, the flow rate of dichlorosilane may be 1.2 to 1.8 times the flow rate of HCl.

A typical deposition rate is approximately 60 nm/min.

On account of this selectivity of the growth on silicon compared to the growth on silicon oxide, growth can take place on regions where there is already a covering of silicon. The oxide regions can remain uncovered. The growing seeds can spread out laterally, and at the same their thickness can increase slightly, as shown in FIG. 8, until a point at which the silicon regions 12 overlap, as shown in FIG. 9, is reached. The situation may also arise wherein cavities are formed at the interface between silicon oxide and epitaxially grown silicon.

Ultimately, during further growth, a planar, epitaxially grown silicon front can be established, as shown in FIG. 9. During the selective epitaxy process, a polysilicon layer can be formed on the polysilicon filling, as shown in FIG. 2. The selective epitaxy can be continued until a space of approximately 20 to 40 nm can remain between epitaxially grown silicon 12 and polysilicon, which has grown on the polysilicon filling 6, in order to minimize possible dislocations and defects which would be attributable to epitaxial silicon and polysilicon adjoining one another (c.f. FIG. 12).

Figure 10:
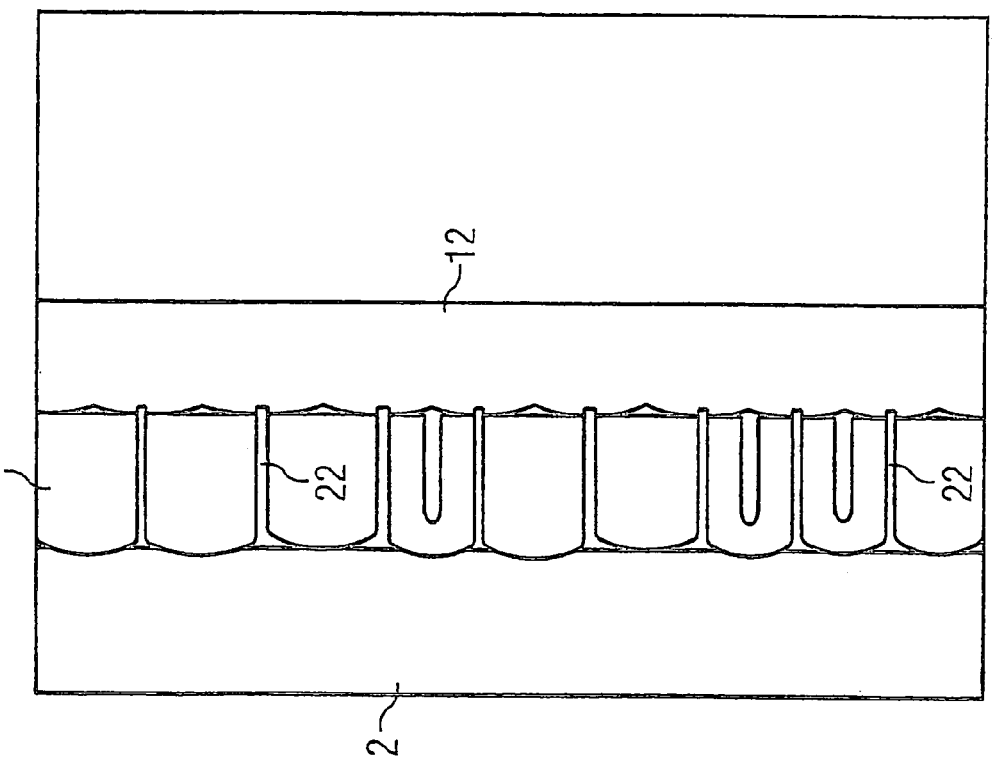

If appropriate, a hydrogen reflow process can then be carried out in order to further planarize the epitaxially grown silicon front. The hydrogen reflow process may be carried out in a hydrogen atmosphere for 60 seconds at, for example, 1050° C. Depending on the geometry of the surface, a lower temperature may be used in order to avoid dislocations in the epitaxial layer. A cross section with planarized silicon layer is shown in FIG. 10.

If appropriate, a partial oxidation step can then be carried out at elevated temperature, for example, 1000° C., by which the excess oxygen, which is present in the electrochemically formed oxide, for example, as a result of the incorporated OH groups, leads to partial oxidation of the silicon needles which serve as seeds. In this way, as shown in FIG. 10, the epitaxially grown silicon region can be electrically insulated from the substrate.

Alternatively, a partial oxidation after the epitaxy has commenced, but before the epitaxial layer is completely continuous is possible. After a subsequent cleaning step using HF in order to eliminate surface oxides, the selective epitaxy process can be continued until a continuous epitaxial layer is present.

However, this step may also be omitted, in particular, in order to prevent floating body effects, i.e., undesirable effects caused by the channel region being electrically insulated from the outside world, occurring in a vertical field-effect transistor whose channel region is produced in the epitaxially grown silicon region. The electrical contact between epitaxially grown silicon region and substrate is not critical if a few silicon needles are present at a great distance from one another and the oxide thickness is relatively large compared to the depth of the transistor formed.

In the embodiment described, the distance between the silicon needles can be approximately 20 to 50 nm. The oxide thickness can be approximately 20 to 50 nm, and the layer thickness of the epitaxially grown silicon layer can be approximately 50 to 100 nm.

This then results in the structure of the capacitor trench with SOI region in the upper trench part which is shown in FIG. 12.

The vertical field-effect transistor can then be completed, as described.

An approximately 0.8 nm thick $Si_3N_4$ layer 19 can be produced by a thermal nitriding process, for example, in a $NH_3$ atmosphere. This $Si_3N_4$ layer can avoid negative effects, if grain boundaries between the polysilicon, which has been grown on the polysilicon filling 6 and the epitaxially produced silicon layer 12, butt against one another (cf. FIG. 13).

Then, an in-situ $n^+$-doped polysilicon filling 20 can be deposited using known processes, as shown in FIG. 14, and can be removed down to the top edge of the epitaxially grown silicon layer by chemical mechanical polishing and etching (cf. FIG. 15).

Figure 16:
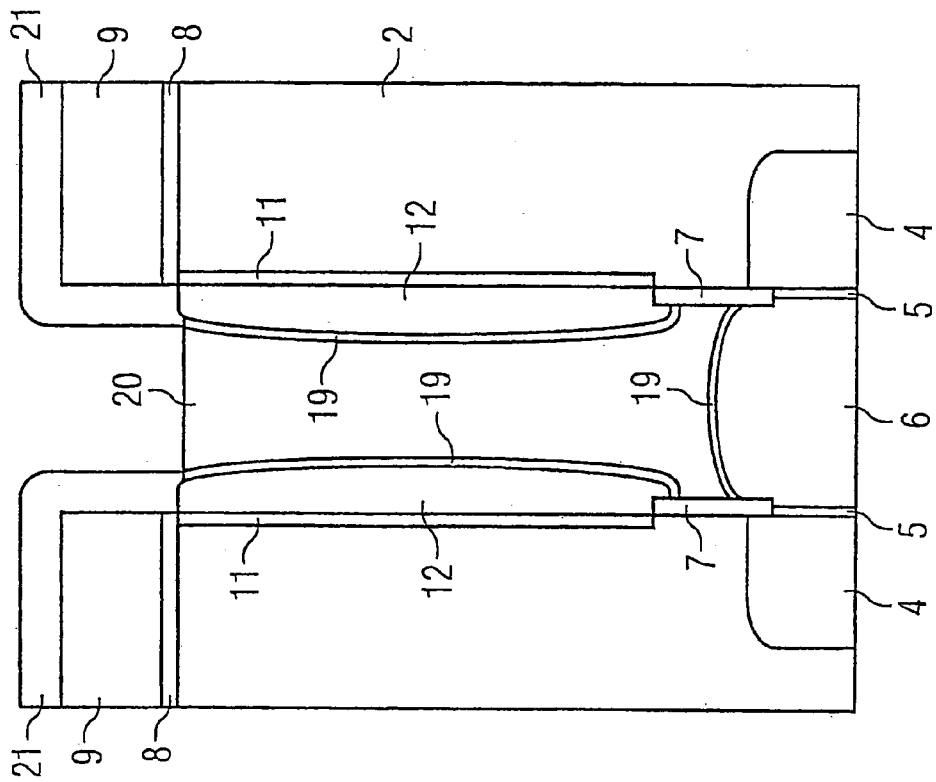
Figure 17:
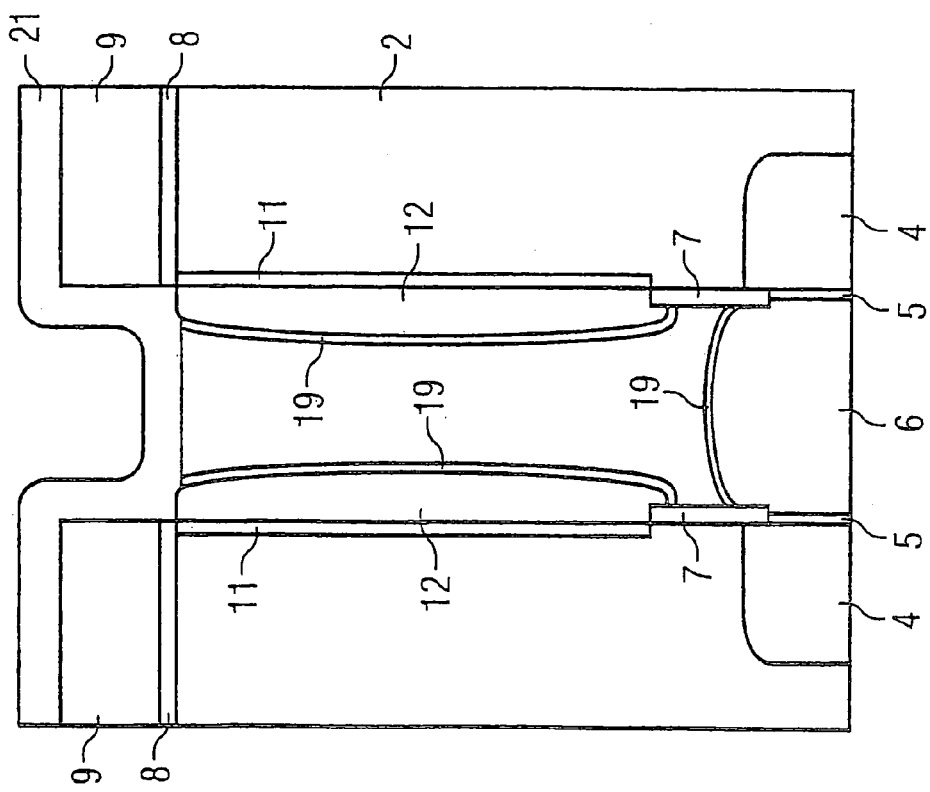

Then, as shown in FIG. 16, a silicon nitride spacer layer 21, which is approximately 25 to 45 nm thick, can be deposited. The object of this layer is to cover the silicon edges, which are in single-crystal form, in a subsequent step for etching of the gate region. Accordingly, the thickness of this layer is dependent on the thickness of the region which is to be etched away. Then, the spacer base can be etched clear using known processes, as shown in FIG. 17.

Figure 18:
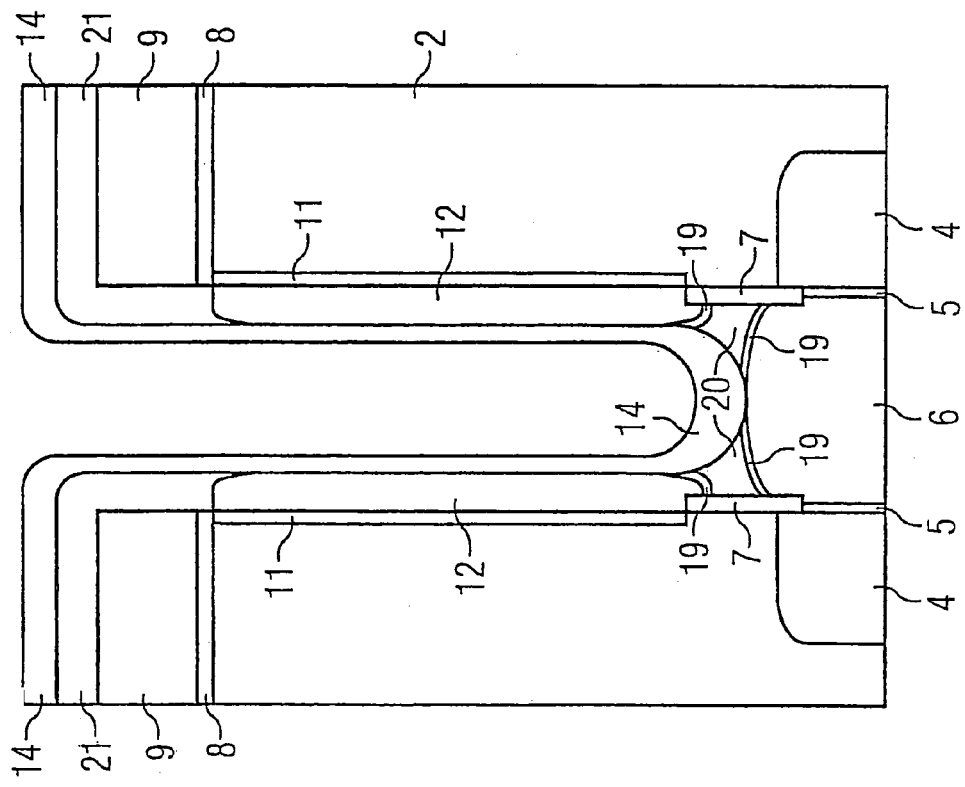

Now, a step for reactive ion etching of the gate region can be carried out, for example, with $SF_6$ as etching gas, in which step the $n^+$-doped polysilicon filling 20 can be removed apart from a small residue in the lower region of the trench. The remaining polysilicon filling 20 can form a buried strap for the electrical connection of upper capacitor electrode 6 and silicon 12 in single-crystal form. Furthermore, the walls of the silicon layer 12 in single-crystal form can be straightened by the etching step (cf. FIG. 18).

Figure 19:
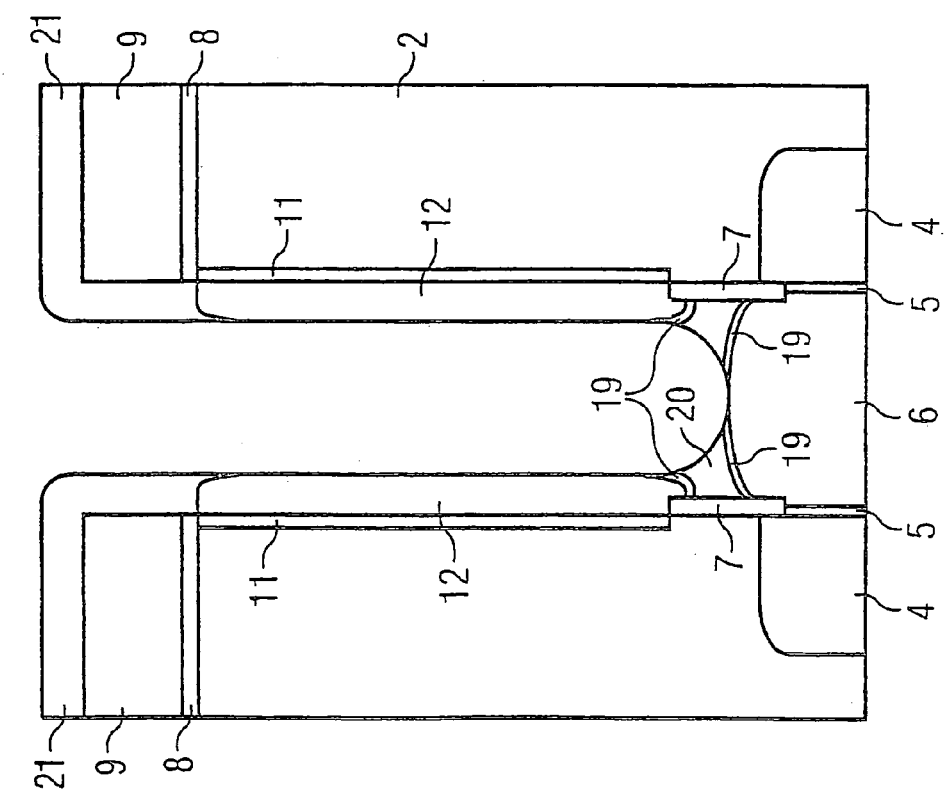

Then, as shown in FIG. 19, an $SiO_2$ layer 14 can be deposited, for example, using a high density plasma oxidation process. The object of this layer is to ensure complete insulation of the lowermost trench region with respect to the gate electrode 17 which is yet to be formed. Since during the formation of the standard gate oxide layer sufficiently thick layer above the polysilicon region 20 cannot be quaranteed, in this case, a deposition process in which a higher layer growth rate is produced on the horizontal regions than on the vertical regions can be selected. In the case of a high density plasma oxidation process, for example, a combination of deposition and backsputtering processes can be used. Accordingly, the $SiO_2$ layer 14, which is deposited, can have a planar thickness of approximately 40 nm and a thickness of approximately 8 nm at the side walls.

Figure 20:
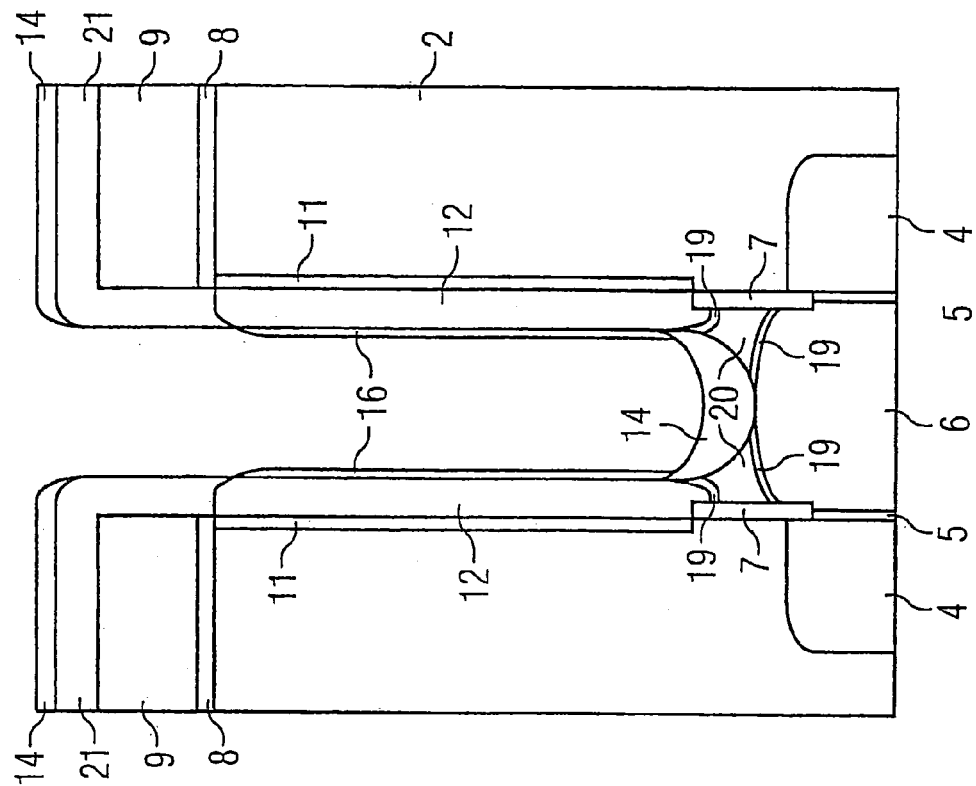

The $SiO_2$ layer 14, which has been produced on the trench walls, can be removed again by a subsequent isotropic oxide etch using known processes (cf. FIG. 20).

Figure 21:
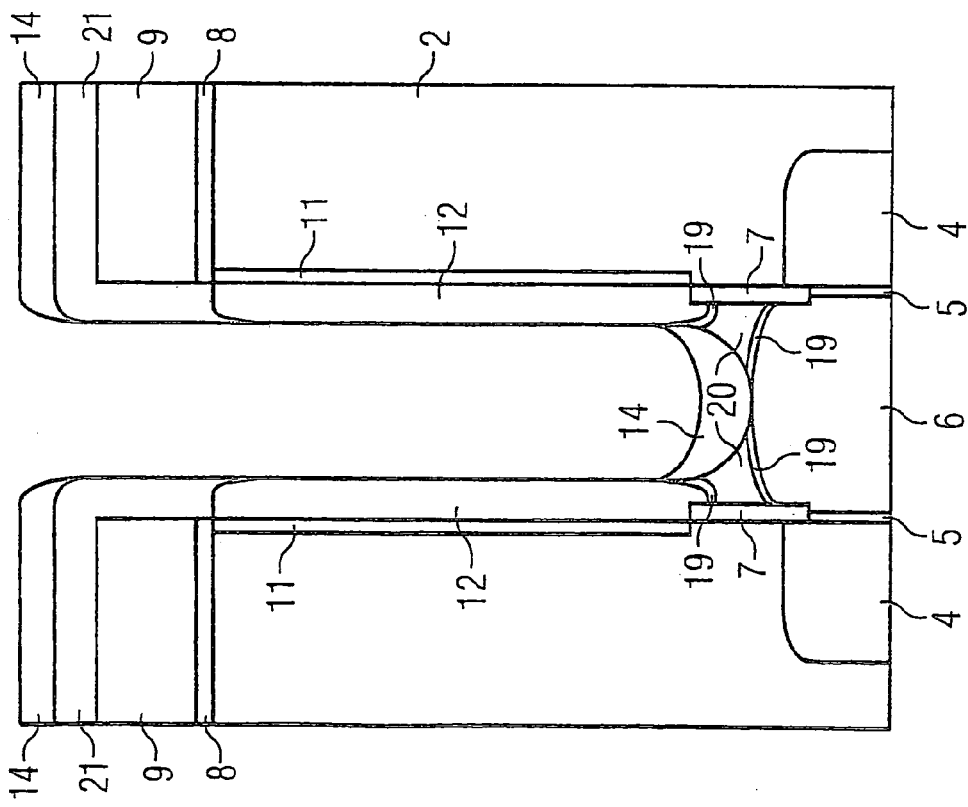
Figure 22:
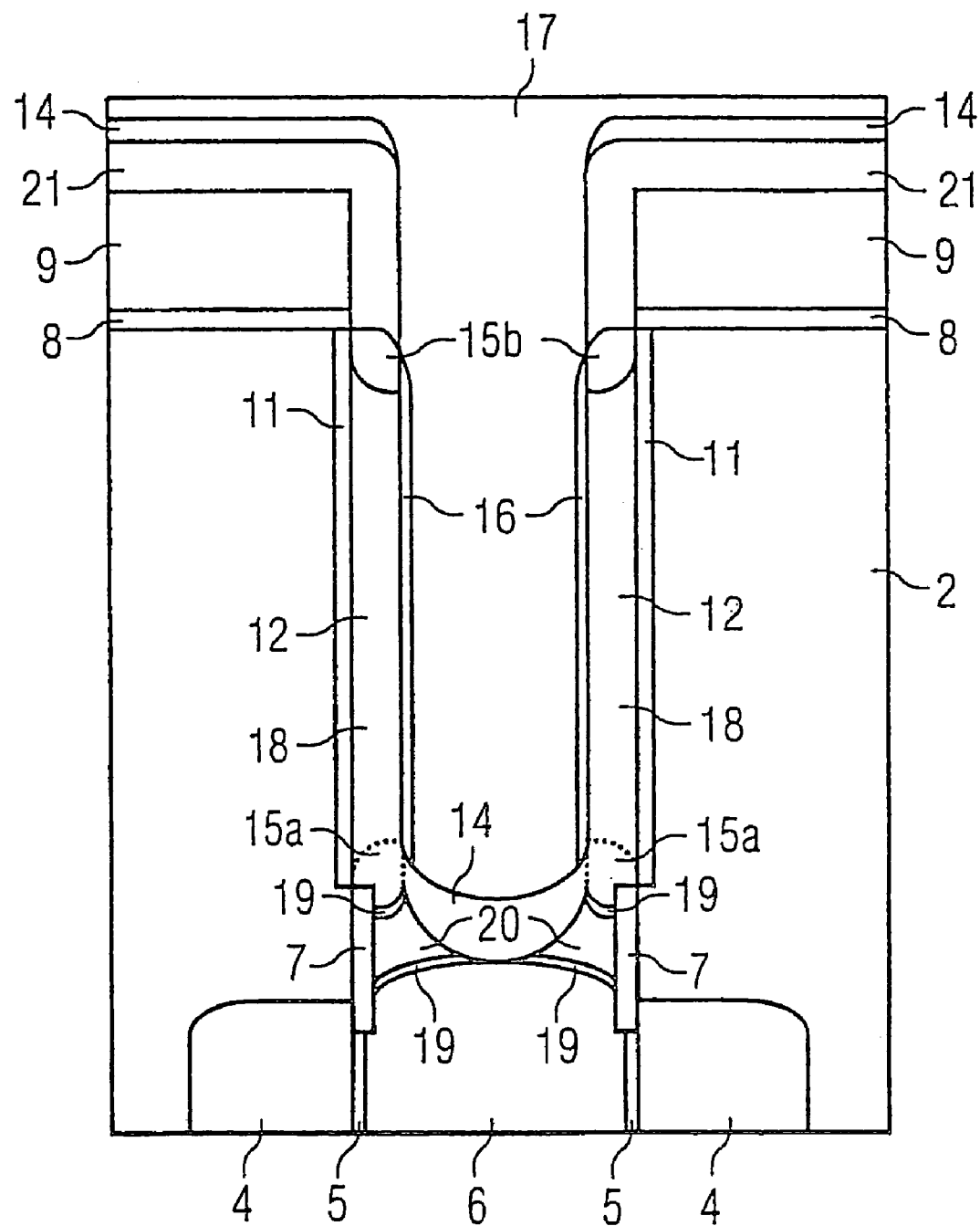

Then, known processes are used to produce an approximately 5 nm thick gate oxide layer 16 by thermal means on the silicon regions 12 which are in single-crystal form (cf. FIG. 21). Then, the gate electrode 17 can be produced using known processes, for example, by polysilicon or polysilicon and metal being deposited and then etched back again (cf. FIG. 22). A source/drain region 15a, which serves as source/drain electrode, in the lower trench region can be formed by outdiffusion of the dopants from the highly doped polysilicon filling 20, which forms the buried strap, in a subsequent heat-treatment step carried out, for example, for 1 minute at 1050° C.

The channel region 18 and the source/drain regions can be insulated and separate from the substrate 2 by the silicon oxide layer 11 and the remaining section of the collar oxide 7. The silicon oxide 11 can be silicon dioxide.

The further processing then takes place in a similar manner to that used for the existing concepts for vertical transistors. In particular, insulation structures can be produced in order to insulate the memory cells from one another. Then, the source/drain region 15b can be formed in the upper trench region by ion implantation using processes which are customarily employed.

Then, wordlines and bit lines can be defined using known processes, and the upper source/drain region can be connected to the bit line via a bit-line contact in accordance with processes which are customarily used in vertical transistors.

Then, the memory cell arrangement can be completed in a known way by the formation of further wiring levels.

Figure 23:
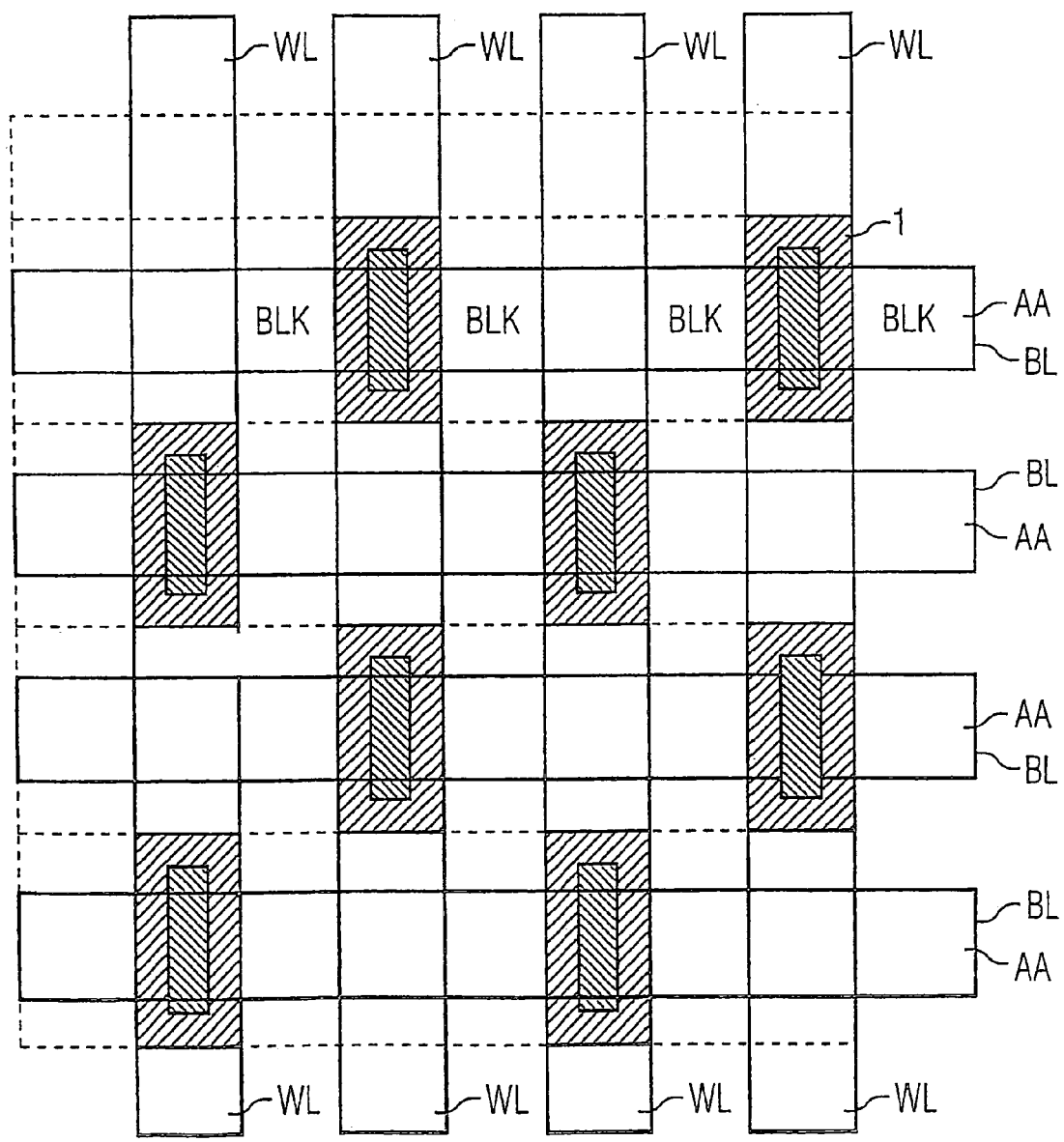
FIG. 23 shows the layout of a memory cell arrangement with vertical select transistors.

The memory cell arrangement, the layout of which is illustrated, for example, for an 8-$F^2$ cell architecture in FIG. 23, has, for each memory cell, one storage capacitor arranged in one of the trenches 1 and two vertical select transistors. Each memory cell requires a space of $8F^2$, where F is the minimum feature size, which can be fabricated in the corresponding technology. The bit lines BL run in strip form and parallel to one another, the width of the bit line BL in each case being F, and the distance between the bit lines BL in each case likewise being F. The wordlines WL, which likewise have a width of F and are at a distance of F from one another, can run perpendicular to the bit lines. The active areas AA can be in each case, arranged in strip form below the bit lines BL. The bit-line contacts BLK, which allow an electrical connection to be made between the respective bit line BL and the active area AA, can be, in each case, arranged between the crossing wordlines WL. The trenches 1 can be arranged below the wordline WL.

The select transistors can be arranged in each memory cell, in each case, at the side walls between trench 1 and active area AA. The transistor regions, which run around in the shape of a ring in FIG. 22, can be cut off by the insulation regions for defining the active areas, so that each trench 1 can include two select transistors. The trenches 1 of adjacent active area strips can be, in each case, arranged offset with respect to one another, resulting in a chessboard-like pattern.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Capacitor trench
2 Silicon substrate
3 n-doped silicon
4 $n^+$-doped silicon
5 Capacitor dielectric
6 Upper capacitor electrode
7 Insulation collar
8 Silicon dioxide
9 Silicon nitride
10 Mesopores 11 Silicon oxide layer
12 Epitaxial silicon regions
13 Sio$_2$ layer
14 Sio$_2$ region
15a,b Source/drain electrode
16 Gate oxide layer
17 Gate electrode
18 Channel region
19 Si$_3$N$_4$ layer
20 n$^+$-doped polysilicon
21 Si$_3$N$_4$ spacer
22 Silicon rib regions in single-crystal form

We claim:

1. A method for forming a layer stack comprising silicon oxide and a monocrystalline silicon layer on a silicon surface region of a semiconductor substrate, comprising:
   forming mesopores in the silicon surface region;
   oxidizing the mesopore surface to form silicon oxide and rib regions from silicon in single-crystal form, the rib regions remaining in place between adjacent mesopores, the oxidizing ending when a predetermined minimum silicon wall thickness of the rib regions is reached;
   uncovering the rib regions, the rib regions being arranged at an end remote from the semiconductor substrate, between adjacent mesopores; and carrying out a selective epitaxy process such that silicon grows on the uncovered rib regions, selectively with respect to the silicon oxide regions.

2. The method according to claim 1, further comprising:
   heat-treating such that the silicon rib regions are oxidized.

3. The method according to claim 2, wherein the oxidation of the silicon rib regions is carried out after the selective epitaxy process has commenced and before a continuous epitaxial layer has been reached.

4. The method according to claim 1, wherein a diameter of the rib regions ranges from 5 to 15 nm.

5. The method according to claim 1, wherein the rib regions arranged at an end remote from the semiconductor substrate are uncovered by wet-chemical etching.

6. The method according to claim 1, wherein a thickness of the oxide layer formed ranges from 10 to 50 nm.

7. The method according to claim 1, wherein the oxidation of the mesopore surface is carried out electrochemically.

8. The method according to claim 1, wherein the oxidation of the mesopore surfaces ends when an end point of the oxide formation has been reached.

* * * * *